United States Patent
Wang et al.

(10) Patent No.: US 7,224,197 B2
(45) Date of Patent: May 29, 2007

(54) FLIP-FLOP IMPLEMENTED WITH METAL-OXIDE SEMICONDUCTORS USING A SINGLE LOW-VOLTAGE POWER SUPPLY AND CONTROL METHOD THEREOF

(75) Inventors: Jinn-Shyan Wang, Chia-Yi (TW); Hung-Yu Li, Chia-Yi (TW)

(73) Assignee: National Chung Cheng University, Chia-Yi (TW)

( * ) Notice: Subject to any disclaimer, the term of this patent is extended or adjusted under 35 U.S.C. 154(b) by 105 days.

(21) Appl. No.: 11/211,666

(22) Filed: Aug. 26, 2005

(65) Prior Publication Data
US 2007/0046352 A1    Mar. 1, 2007

(51) Int. Cl.
*H03K 3/289* (2006.01)
(52) U.S. Cl. ........................... 327/202; 327/211
(58) Field of Classification Search ................ 327/200, 327/202–203, 208, 210–212, 214–219
See application file for complete search history.

(56) References Cited

U.S. PATENT DOCUMENTS

| | | | | |
|---|---|---|---|---|
| 6,456,113 B2* | 9/2002 | Kanba | | 326/93 |
| 6,560,737 B1* | 5/2003 | Colon-Bonet et al. | | 714/726 |
| 6,617,902 B2* | 9/2003 | Tokumasu et al. | | 327/211 |
| 6,714,060 B2* | 3/2004 | Araki | | 327/202 |
| 6,803,799 B1* | 10/2004 | Churchill et al. | | 327/202 |

* cited by examiner

*Primary Examiner*—My-Trang Nu Ton
(74) *Attorney, Agent, or Firm*—Rosenberg, Klein & Lee

(57) ABSTRACT

The present invention discloses a flip-flop implemented with metal-oxide semiconductors using a single low-voltage power supply and a control method thereof, wherein an external control signal is input to a power switch in order to turn on the power switch for an active mode or to turn off the power switch for a sleep mode and inputting an external sleep control signal; the power switch is used to control a combinational circuit to enter into the active or the sleep mode, and the combinational circuit is connected to a virtual power supply; an internal clock signal is separately input to a master stage and a slave stage of the flip-flop, and whether to enter into the sleep mode or the active mode is determined by the voltage level of the internal clock signal. In the present invention, all the logic gates of the combinational circuit are formed of low-threshold CMOS's, which enables the present invention to maintain a given operation speed at a lower voltage. The flip-flop of the present invention is formed of both low-threshold and high-threshold elements, whereby not only the operation speed can be maintained but also the leakage current can be suppressed spontaneously, and further, the wake-up time can be shortened.

16 Claims, 4 Drawing Sheets

FLIP-FLOP IMPLEMENTED WITH METAL-OXIDE SEMICONDUCTORS USING A SINGLE LOW-VOLTAGE POWER SUPPLY AND CONTROL METHOD THEREOF

BACKGROUND OF THE INVENTION

1. Field of the Invention

The present invention relates to a structure of metal-oxide-semiconductor flip-flop, particularly to a flip-flop implemented with metal-oxide semiconductors using a single low-voltage power supply and a control method thereof.

2. Description of the Related Art

With the emerging demand for a low power consumption semiconductor, the supply voltage of an integrated chip keeps falling. Based on the multi-threshold CMOS technology (MTCMOS), the supply voltages of several designs have been reduced to as small as 0.5 V. They can be implemented by a bulk MTCMOS technology or a very complex SOI (silicon-on-insulator) technology, and many kinds of MOSFET's with different threshold voltages are needed. Refer to FIG. 1 a schematic diagram of the circuit structure of a conventional super cut-off CMOS (SCCMOS). The flip-flop is composed of components 14, 16, 18, and the flip-flop and a combinational circuit 12 are connected to a virtual power supply VDDV. This circuit structure has been shown to achieve a picoampere sleep-mode leakage current per logic gate with using only low-MOSFET's for a 0.5-V functional core. It can be applied with the SOI or bulk CMOS technology. However, in comparison with the conventional flip-flop, in the SCCMOS, a backup SRAM cell 18 is needed to accompany the flip-flop 14, 16 for retaining data in sleep mode. In addition to a 0.5V supply voltage, an extra −0.5V $V_{SS}$ must be applied to the SRAM cell 18 to enhance the driving capability during wake-up.

With respect to the operation of the SCCMOS, refer to FIG. 2. In the active mode, the external sleep control signal SLP is 1, and the internal clock signal CK is anti-phase to the external clock signal CKE in order to match with the negative-edge-triggered SAFF (sense-amplifier-based flip-flop); the control signal VG is 0, and the power switch 10 is switched on, and then the combinational circuit 12 can obtain current to work normally; the sleep control signal for the flip-flop WL is at a high-level voltage, and the SRAM cell 18 is closed, and the SCCMOS flip-flop works normally. In the sleep mode, the external sleep control signal SLP becomes 0, and the internal clock signal CK stops, and the control signal VG equals VDD+0.4V, and the leakage currents of the combinational circuit 12 and the master stage 14 and the slave stage 16 of the flip-flop are controlled by the power switch 10. Next, WL becomes −0.5V for a short period of time, and the CMOS's 182, 184 open to store the values originally in the flip-flop into N1 or N2 of the SRAM cell 18. When out of the sleep mode, SLP backs to the high level, and the control signal VG backs to 0 to charge the virtual power supply VDDV, and WL backs to −0.5V again for a short period of time, and the values in the SRAM cell 18 is written back to the nodes Q/QB of the flip-flop; lastly, after all the signals are resumed, the internal clock CK works again, and the flip-flop enters into the active mode. From the operational procedures described above, it is found that the problems primarily come from the SRAM cell 18 and the sleep control signal WL of the flip-flop. In addition to an extra −0.5V supply voltage, the WL voltage swing between −0.5V and VDD, and its timing is hard to control. Further, the flip-flop 14, 16, 18 and the combinational circuit 12 share the common virtual power supply VDDV controlled by a voltage switch, which will obviously lower the speed and the stability of the flip-flop.

Owing to the problems discussed above, the present invention proposes a flip-flop implemented with metal-oxide semiconductors using a single low-voltage power supply (single-low-voltage MOS, SLVMOS) and a control method thereof in order to overcome the problems.

SUMMARY OF THE INVENTION

The primary objective of the present invention is to provide a flip-flop implemented with metal-oxide semiconductors using a single low-voltage power supply and a control method thereof, wherein via a single low supply voltage, the circuit can normally operate at a voltage of 0.5V with the operation being at high speed, of low power consumption, and with low leakage current.

Another objective of the present invention is to provide a flip-flop implemented with metal-oxide semiconductors using a single low-voltage power supply and a control method thereof, wherein the power of the flip-flop is directly from the power supply, and no extra leakage-current control switch is needed, and no data backup is needed for entering into the sleep mode, and no resumption time is needed for wake-up.

Yet another objective of the present invention is to provide a flip-flop implemented with metal-oxide semiconductors using a single low-voltage power supply and a control method thereof, wherein via persistently providing power for the flip-flop, the energy for waking up the flip-flop is pretty little, and the time for wake-up is shorter.

Further another objective of the present invention is to provide a flip-flop implemented with metal-oxide semiconductors using a single low-voltage power supply and a control method thereof, wherein the flip-flop can operates without any sleep control signal so that the routing resources can be saved, and the power consumption can be lower, and the operation speed can be raised.

To achieve the abovementioned objectives, the present invention provides a flip-flop implemented with metal-oxide semiconductors using a single low-voltage power supply and a control method thereof, comprising: a power switch, with both ends separately connected to a power supply and a virtual power supply and being controlled by an external control signal; a combinational circuit, composed of multiple transistors, with one end connected to the virtual power supply and another end grounded, wherein the active mode and the sleep mode of the combinational circuit are controlled by the power switch; a master stage of the flip-flop, composed of multiple low-threshold transistors, with the power thereof being directly from the power supply; and a slave stage of the flip-flop, composed of a latch and two P-C$^2$MOS's, with the power thereof being directly from the power supply, and inputting an internal clock signal separately to the master stage and the slave stage of the flip-flop. The present invention has the advantages of simplifying system design, promoting efficiency and lowering power consumption in the active mode, having capability of controlling leakage current in the sleep mode, shortening the wake-up time, and reducing the wake-up energy.

To enable the objectives, technical contents, characteristics, and accomplishments of the present invention to be more easily understood, the embodiments of the present invention are to be described below in detail.

DETAILED DESCRIPTION OF THE INVENTION

The present invention provides a flip-flop implemented with metal-oxide semiconductors using a single low-voltage power supply and a control method thereof, wherein via the design of utilizing a single low supply voltage, the design of the system is simplified; the working voltage is lowered; the efficiency is promoted; the power consumption is reduced; the leakage current in the sleep mode is controlled; the time for wake-up is shortened; and the energy for wake-up is lessened. Further, the present invention can be applied to any pipeline system to reduce or omit the control lines for the sleep mode and save the routing resources. Furthermore, the present invention can also be applied to a twin-well or a triple-well bulk of complementary metal-oxide-semiconductor (bulk CMOS) process, or even to a more advanced silicon-on-insulator (SOI) process. Therefore, the present invention has a very slight process-dependency.

Figure 3:
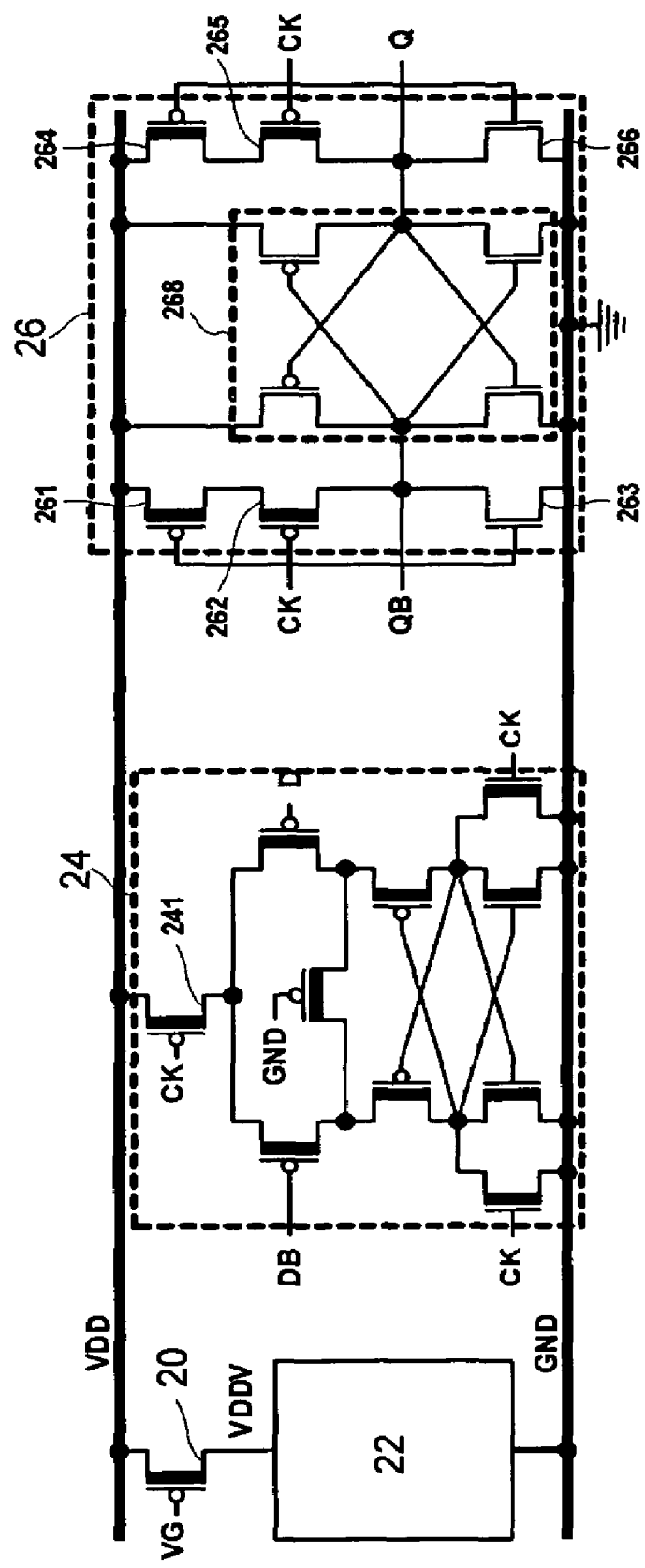
FIG. 3 is a schematic diagram showing the structure of the flip-flop implemented with metal-oxide semiconductors using a single low-voltage power supply according to the present invention.

Refer to FIG. 3 showing the flip-flop structure according to the present invention and the power source thereof. The negative-edge-triggered flip-flop according to the present invention comprises: a power switch 20, with one end connected to a combinational circuit 22, wherein a virtual power supply VDDV is disposed between the power switch 20 and the combinational circuit 22, and with another end connected to a power supply VDD, and with the power switch 20 being controlled by a control signal VG; a combinational circuit 22, composed of multiple low-threshold CMOS transistors, with one end connected to the virtual power supply VDDV and another end grounded, and with the active and sleep modes thereof being controlled by the power switch 20; a master stage 24 of the flip-flop, composed of multiple low-threshold transistors, with the power source thereof connected to the power supply VDD and the power thereof directly supplied by VDD; and a slave stage 26 of the flip-flop, composed of two P-C$^2$MOS's 261, 262, 263, 264, 265, 266 and a latch 268, with the power source thereof also connected to the power supply VDD; wherein an internal clock signal is input from the outside separately to the master stage 24 and the slave stage 26 of the flip-flop. The P-C$^2$MOS's 261, 262, 263, 264, 265, 266 utilize mixed threshold voltages; the CMOS's 261, 262, and 264, 265, which are stacked in series, utilize low-threshold transistors in order to provide a higher driving force in the active mode; as the CMOS's 263, 266 are free from series-connections, high-threshold transistors are adopted in order to lower the leakage current.

Figure 4:
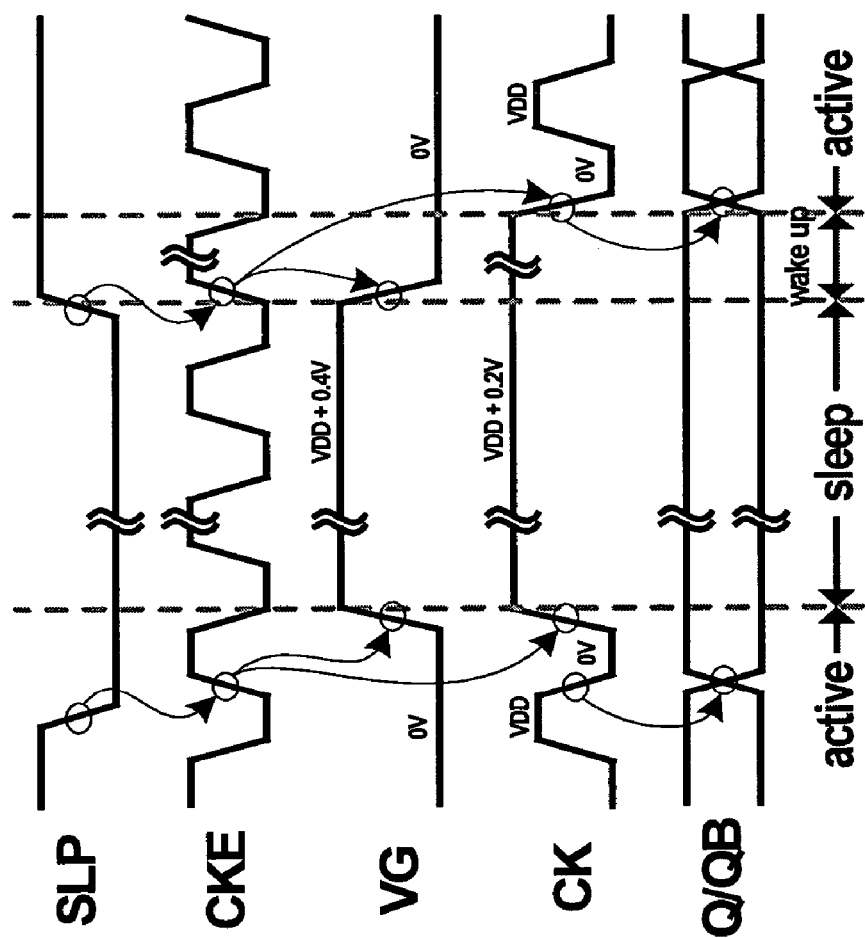
FIG. 4 is a schematic diagram showing the signal timing according to the present invention.

Refer to FIG. 4 showing the operation of the flip-flop of the present invention. In the active mode, the external sleep control signal SLP is 1; the internal clock signal CK is inversed to the external clock signal CKE to match with the single-low-supply-voltage flip-flop of the present invention; the control signal VG is 0; the combinational circuit 22 operates normally; and the flip-flop 24, 26 operates normally. In the sleep mode, the external sleep control signal SLP becomes 0; the control signal VG becomes VDD+0.4V; the internal clock signal CK stops and rises to VDD+0.2V so that the CMOS's 241, 262 and 265 of the flip-flop 24, 26 can create reversed bias to reduce the leakage current in the master stage 24 and the slave stage 26 of the flip-flop, i.e. all the paths of leakage current in the master stage 24 and the slave stage 26 of the flip-flop are effectively suppressed. As the flip-flop 24, 26 is directly connected to the power supply VDD, the latch 268 can spontaneously retain data, and no backup data is needed. As the latch 268 is composed of high-threshold transistors, it has a very low leakage current and needs no extra control. In the active mode, the latch 268 functions as a latch to avoid the data errors resulting from the floating of the P-C$^2$MOS's 261, 262, 263, 264, 265, 266. In the sleep mode, the very low leakage current of the latch 268 can retain the data having existed before entering into the sleep mode. When the circuit is being resumed, the external sleep control signal SLP backs to the high level, and once the virtual power supply has returned to its voltage level, the internal clock signal CK operates normally again, and then, the entire circuit backs to the active mode.

From the operation described above, it can be found that the leakage current can be effectively suppressed in the sleep mode because the present invention utilizes the mixed thresholds and raises the voltage level of the clock signal of the flip-flops in the sleep mode. Therefore, the flip-flop of the present invention needs neither to pass through an extra low-leakage-current power switch nor to add any extra latch for data backup, such as a SRAM cell, but can be directly connected to the power supply VDD. Thus, for the present invention, in the transition between the sleep mode and the active mode, data backup and data resumption are no more needed, so that the sleep or the wake-up action can be implemented at a higher speed and with a lower energy. Further, the present invention's flip-flop implemented with CMOS's using a single low-voltage power supply does not need any extra signal line for the sleep control but itself can determine whether to enter into the sleep mode according to the voltage level of the internal clock. As no signal line for sleep control is needed, the complexity of the flip-flop design can be reduced, and the space occupied by the sleep control lines distributed everywhere can also be saved. The VDD+0.2V needed by the clock signal of the flip-flop can be provided by the high voltage level of the control signal VG in the sleep mode, and no extra line is needed to provide the VDD+0.2V.

As the present invention utilizes the mixed thresholds, the leakage current can be effectively suppressed in the sleep mode; thus, the flip-flop of the present invention needs neither to pass through an extra low-leakage-current power switch nor to add any extra latch for data backup, such as a SRAM cell, but can be directly connected to the power supply VDD; therefore, compared with the other conventional circuit structure, the circuit structure of the present invention can operate at a higher speed. As not sharing current with the flip-flop, the combinational circuit can obtain more current from the power switch, and thus, the speed loss thereof can be further lessened. Furthermore, as the stray capacitance of the virtual power supply VDDV is also reduced, the time and the energy needed by the wake-up action are lessened. Moreover, as the flip-flop can avoid the current clutter acting on the virtual power supply VDDV during the combinational logic operation, the stability of the circuit is promoted.

Figure 1:
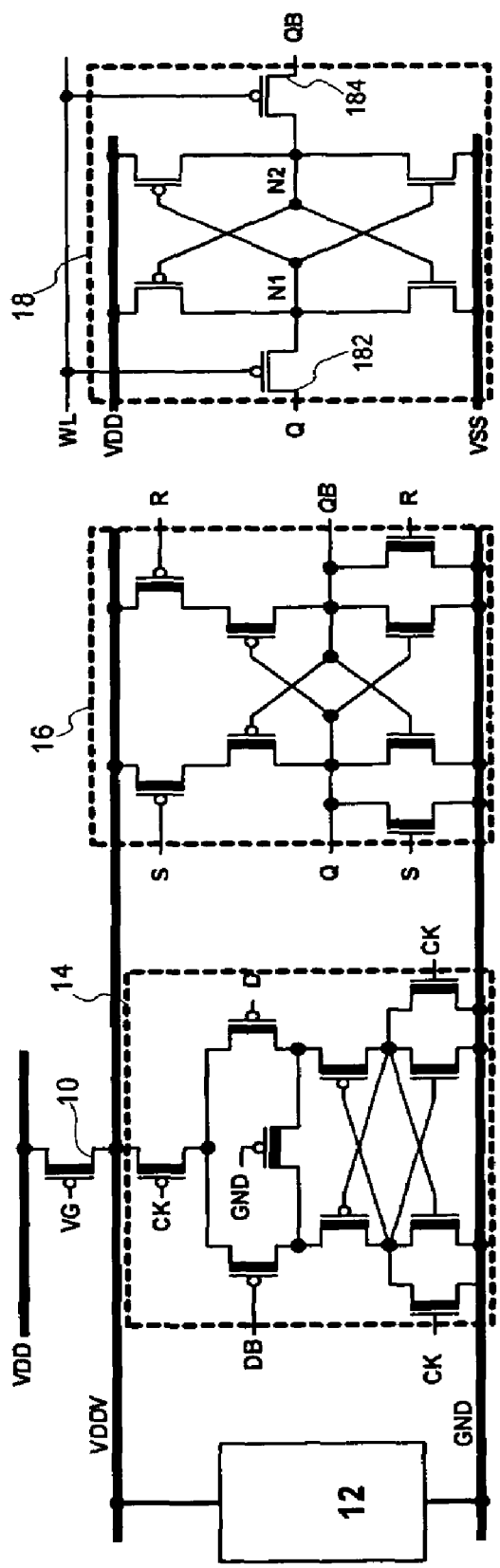
FIG. 1 is a schematic diagram showing the structure of a conventional SCCMOS.
Figure 2:
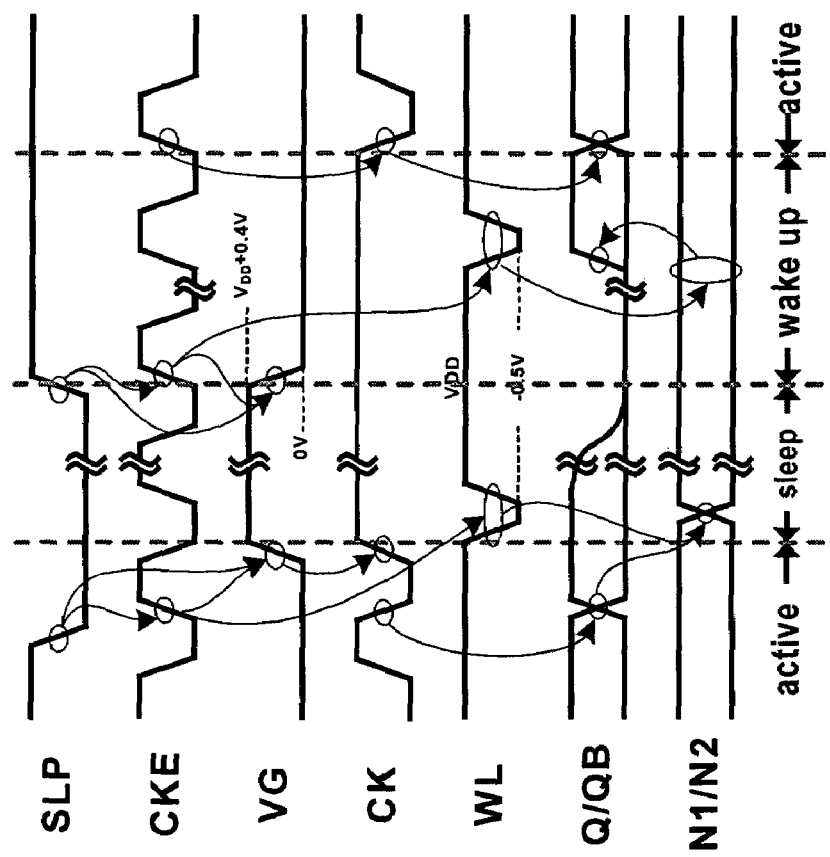
FIG. 2 is a schematic diagram showing the signal timing of the conventional technology.

Refer to FIG. 1 showing the structure of the conventional SCCMOS and FIG. 3 showing a schematic structure diagram of the flip-flop of the present invention in order to compare the present invention with the conventional technology. It is found: all the voltage sources in the present invention needn't pass through a power switch but are directly connected to the power supply VDD. Contrarily, the supply voltage of the SCCMOS must pass through a power switch. The flip-flop of the present invention needs only a single low-voltage current source to provide power, and the power needn't be switched off in the sleep mode. Contrarily, the flip-flop of the SCCMOS needs both VDD and VDDV to provide power, and a portion of them is switched off in the sleep mode. In the present invention, in the sleep mode, the clock signal is raised to a voltage higher than the supply voltage and maintained at that voltage so that the leakage current can be suppressed in all the probable paths in the flip-flop. Such a design can be free from the chip-global routing of the sleep control signal lines, which not only can save the precious routing resources but also implicitly contributes to reducing the stray capacitance, so that the probability of lowering power consumption and raising speed is increased. On the contrary, the SCCMOS and the zigzag SCCMOS lack the abovementioned advantages.

In summary, the present invention provides a flip-flop implemented with metal-oxide semiconductors using a single low-voltage power supply and a control method thereof. Via utilizing a single low supply voltage, the design of the system is simplified. Even under the environment that the transistor has such a high threshold, e.g. 0.3 or 0.5V, the working voltage can still be lowered to 0.5V. In the active mode, the present invention can promote efficiency and lower power consumption. In the sleep mode, the present invention can control the leakage current, shorten the wake-up time, and reduce the wake-up energy. Further, the present invention can be applied to any pipeline system to reduce or omit the control lines for the sleep mode and save the routing resources. The circuit structure of the present invention is universally applicable to a general digital logic circuit and is completely compatible with the current design process of the digital circuit, and the cell development is also completely compatible with the conventional dual-rail cell library; therefore, the present invention can be easily, rapidly and conveniently utilized by a general user or a designer. Furthermore, the present invention can also be applied to the twin-well or the triple-well bulk CMOS, or even to the more advanced SOI process. Therefore, the present invention has a very slight process-dependency.

Those described above are only the preferred embodiments of the present invention and not intended to limit the scope of the present invention. Any equivalent modification and variation according to the spirit of the present invention is to be included within the scope of the claims of the present invention.

What is claimed is:

1. A flip-flop implemented with metal-oxide semiconductors using a single low-voltage power supply, comprising:
    a power switch, with both ends separately connected to a power supply and a virtual power supply, and being controlled by an external control signal;
    a combinational circuit, composed of multiple transistors, with one end connected to said virtual power supply and another end grounded, and with the active mode and the sleep mode thereof being controlled by said power switch;
    a master stage of said flip-flop, composed of multiple low-threshold transistors, with a power source thereof directly connected to said power supply; and
    a slave stage of said flip-flop, composed of a latch and two P-$C^2$MOS's, with the power source thereof being directly connected to said power supply, and inputting an internal clock signal separately to said master stage and said slave stage of said flip-flop.

2. The flip-flop implemented with metal-oxide semiconductors using a single low-voltage power supply according to claim 1, wherein said power switch is a low-threshold one.

3. The flip-flop implemented with metal-oxide semiconductors using a single low-voltage power supply according to claim 1, wherein said latch is formed of high-threshold transistors.

4. The flip-flop implemented with metal-oxide semiconductors using a single low-voltage power supply according to claim 1, wherein in the sleep mode, said control signal is concealed inside said clock signal.

5. The flip-flop implemented with metal-oxide semiconductors using a single low-voltage power supply according to claim 1, wherein said combinational circuit, and said master stage and said slave stage of said flip-flop are all grounded.

6. The flip-flop implemented with metal-oxide semiconductors using a single low-voltage power supply according to claim 1, wherein said flip-flop is a negative-edge-triggered one.

7. The flip-flop implemented with metal-oxide semiconductors using a single low-voltage power supply according to claim 6, wherein said master stage and said slave stage of said flip-flop can become a positive-edge-triggered flip-flop via a logic complementation.

8. The flip-flop implemented with metal-oxide semiconductors using a single low-voltage power supply according to claim 1, wherein in the active mode, the voltage level of said internal clock signal swings with the voltage of an external power source.

9. The flip-flop implemented with metal-oxide semiconductors using a single low-voltage power supply according to claim 1, wherein in the sleep mode, the voltage level of said internal clock signal is raised to and maintained at VDD+0.2V.

10. A control method of a flip-flop implemented with metal-oxide semiconductors using a single low-voltage power supply, comprising the following steps:
    inputting an external control signal to a power switch in order to turn on said power switch for an active mode or to turn off said power switch for a sleep mode and inputting an external sleep control signal;
    utilizing said power switch to control a combinational circuit to enter into said active mode or said sleep mode, wherein said combinational circuit is connected to a virtual power supply; and
    inputting an internal clock signal separately to a master stage and a slave stage of said flip-flop, wherein whether to enter into said sleep mode or said active mode is determined by the voltage level of said internal clock signal.

11. The control method of a flip-flop implemented with metal-oxide semiconductors using a single low-voltage power supply according to claim 10, wherein in said active mode, the voltage level of said internal clock signal swings with the voltage of an external power source.

12. The control method of a flip-flop implemented with metal-oxide semiconductors using a single low-voltage power supply according to claim 10, wherein in said sleep mode, the voltage level of said internal clock signal is raised to and maintained at VDD+0.2V.

13. The control method of a flip-flop implemented with metal-oxide semiconductors using a single low-voltage power supply according to claim 10, wherein in said sleep mode, said control signal is concealed inside said internal clock signal.

14. The control method of a flip-flop implemented with metal-oxide semiconductors using a single low-voltage power supply according to claim 10, wherein said power switch is a low-threshold one.

15. The control method of a flip-flop implemented with metal-oxide semiconductors using a single low-voltage power supply according to claim 10, wherein in said active mode, said external sleep control signal is 1, and said internal clock signal is inversed to an external clock signal, and said control signal is 0.

16. The control method of a flip-flop implemented with metal-oxide semiconductors using a single low-voltage power supply according to claim 15, wherein in said sleep mode, the voltage of said control signal is VDD+0.4V, and said internal clock signal stops.

* * * * *